(12) United States Patent
Mudegowdar et al.

(10) Patent No.: US 11,233,522 B2
(45) Date of Patent: Jan. 25, 2022

(54) HIGH-SPEED SUCCESSIVE APPROXIMATION ANALOG-TO-DIGITAL CONVERTER WITH IMPROVED MISMATCH TOLERANCE

(71) Applicant: SEMICONDUCTOR COMPONENTS INDUSTRIES, LLC, Phoenix, AZ (US)

(72) Inventors: Ishwar Chandra Mudegowdar, Antwerp (BE); Tomas Pankrac, Antwerp (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/948,790

(22) Filed: Oct. 1, 2020

(65) Prior Publication Data

US 2021/0376850 A1 Dec. 2, 2021

Related U.S. Application Data

(60) Provisional application No. 62/704,788, filed on May 28, 2020.

(51) Int. Cl.
| | | |
|---|---|---|
| *H03M 1/12* | (2006.01) | |
| *H03M 1/38* | (2006.01) | |
| *H03M 1/00* | (2006.01) | |
| *H03M 1/20* | (2006.01) | |
| *H03M 1/36* | (2006.01) | |

(52) U.S. Cl.
CPC ............. *H03M 1/38* (2013.01); *H03M 1/001* (2013.01); *H03M 1/1245* (2013.01); *H03M 1/201* (2013.01); *H03M 1/368* (2013.01)

(58) Field of Classification Search
CPC ........ H03M 1/38; H03M 1/001; H03M 1/368; H03M 1/201; H03M 1/1245
USPC .................................. 341/144, 155, 120, 172
See application file for complete search history.

(56) References Cited

U.S. PATENT DOCUMENTS

| | | |
|---|---|---|
| 6,124,819 A | 9/2000 | Zhou |
| 7,161,520 B2 * | 1/2007 | Liu .......................... H03M 3/34 341/155 |
| 7,265,706 B2 | 9/2007 | Boemler |
| (Continued) | | |

*Primary Examiner* — Peguy Jean Pierre
(74) *Attorney, Agent, or Firm* — Treyz Law Group, P.C.; Jason Tsai

(57) ABSTRACT

An image sensor may contain an array of imaging pixels. Each pixel column outputs signals that are read out using a successive approximation register (SAR) analog-to-digital converter (ADC). The SAR ADC may include at least first and second input sampling capacitors, a comparator, a capacitive digital-to-analog converter (CDAC), and associated control circuitry. If desired, the SAR ADC may include a bank of more than two input sampling capacitors alternating between sampling and conversion. The first capacitor may be used to sample an input signal while conversion for the second capacitor is taking place. Prior to conversion, an input voltage of the comparator and an output voltage of the CDAC may be initialized. During conversion of the signal on the first capacitor, the first capacitor is embedded within the SAR ADC feedback loop to prevent charge sharing between the input sampling capacitor and the CDAC, thereby mitigating potential capacitor mismatch issues.

22 Claims, 12 Drawing Sheets

(56) References Cited

U.S. PATENT DOCUMENTS

| | | | | |
|---|---|---|---|---|
| 8,054,210 B2 * | 11/2011 | Purcell | .................... | H03M 1/08 |
| | | | | 341/169 |
| 9,013,442 B2 | 4/2015 | Hotelling | | |
| 10,784,882 B2 * | 9/2020 | Kang | ................... | H03M 1/0624 |
| 10,826,516 B2 * | 11/2020 | Lee | ...................... | H03M 1/1038 |
| 10,862,498 B1 * | 12/2020 | Chen | ..................... | H03M 1/462 |
| 2007/0236380 A1 | 10/2007 | La Rue | | |
| 2015/0137854 A1 * | 5/2015 | Li | ........................ | H03M 1/1255 |
| | | | | 327/93 |
| 2015/0372691 A1 | 12/2015 | Mandal | | |
| 2020/0274546 A1 * | 8/2020 | Kim | ...................... | H03M 1/466 |

\* cited by examiner

HIGH-SPEED SUCCESSIVE APPROXIMATION ANALOG-TO-DIGITAL CONVERTER WITH IMPROVED MISMATCH TOLERANCE

CROSS-REFERENCE TO RELATED APPLICATIONS

This application claims the benefit of U.S. Provisional Patent Application No. 62/704,788, filed on May 28, 2020, the entire contents of which is incorporated herein by reference.

BACKGROUND

This relates generally to image sensors and more specifically, to image sensors with massively parallel analog-to-digital converters.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is coupled to each pixel column for reading out image signals from the image pixels.

Conventional image sensors often include analog-to-digital converters (ADCs) for converting analog signals generated from the image pixels to digital signals. To increase throughput, image sensor ADCs are often implemented as parallel ADCs with multiple input sampling capacitors connected to a shared successive approximation register (SAR) ADC or as parallel ADCs operating in a pipelined fashion so that a sampling operation can occur simultaneously with another conversion operation. If care is not taken, any mismatch in the input sampling capacitors and their associated non-linearities would manifest themselves as signal dependent/independent and random/systematic offset in the processed data. Such deficiency is due the process of sharing the input charge sampled on the input sampling capacitor with the binary weighted capacitors of the capacitive digital-to-analog converter (DAC) in a SAR ADC, as the charge sharing process is very sensitive to capacitor mismatches, parasitic capacitances, and associated non-linearities. This process of transferring the sampled input charge onto the capacitive DAC suggests that the common-mode range of the overall ADC would be set by the input signal common-mode range (i.e., the ADC will not be able to accept input signal common-mode ranges beyond its supply voltage range and will therefore have to operate at a higher supply range to accommodate input signals with high common-mode voltage levels), leading to higher power consumption and lower operating speed.

It is within this context that the embodiments herein arise.

DETAILED DESCRIPTION

Embodiments of the present invention relate to image sensors, and more particularly to analog-to-digital conversion within image sensors. It will be recognized by one skilled in the art, that the present exemplary embodiments may be practiced without some or all of these specific details. In other instances, well-known operations have not been described in detail in order not to unnecessarily obscure the present embodiments.

Figure 1:
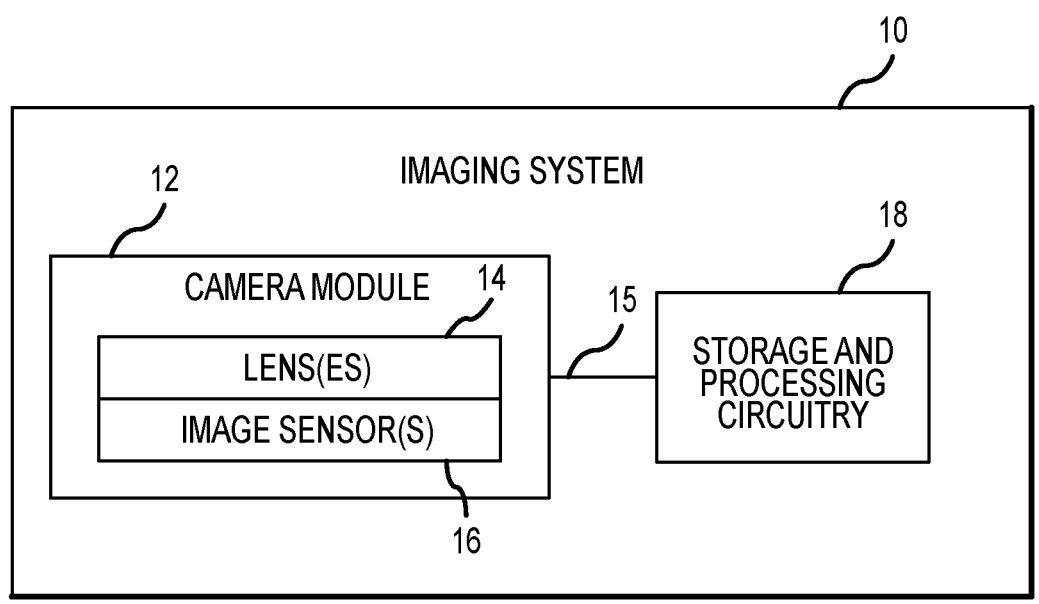
FIG. 1 is a diagram of an illustrative electronic device in accordance with an embodiment.

FIG. 1 is a diagram of an illustrative electronic device in accordance with an embodiment of the present invention. As shown in FIG. 1, imaging system 10 may be a portable imaging system such as a camera, automotive imaging system, cellular telephone, video camera, video surveillance system, or any other desired imaging device that captures digital image data. System 10 may include a camera module 12 that is used to convert incoming light into digital image data. Camera module 12 may include an array of lenses 14 and corresponding image sensor(s) 16. Lens(es) 14 and image sensor(s) 16 may be mounted in a common package and may provide image data to storage and processing circuitry 18 via connection path 15. Image sensor(s) 16 may include one or more image sensors and lens array 14 may include one or more corresponding lenses.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor array 16 or an integrated circuit within module 12 that is associated with image sensor array 16). Image data that has been captured and processed by camera module 12 may, if desired, be further processed and stored using storage and processing circuitry 18. Processed image data may, if desired, be provided to external equipment (e.g., a computer or other device) using wired and/or wireless communications paths coupled to processing circuitry 18.

Each pixel in image sensor(s) 16 may receive light of a given color by providing each image pixel with a color filter. The color filters that are used for image sensor pixels in the image sensors may, for example, be red filters, blue filters, and green filters. Other filters such as white color filters, dual-band IR cutoff filters (e.g., filters that allow visible light and a range of infrared light emitted by LED lights), etc. may also be used.

Figure 2:
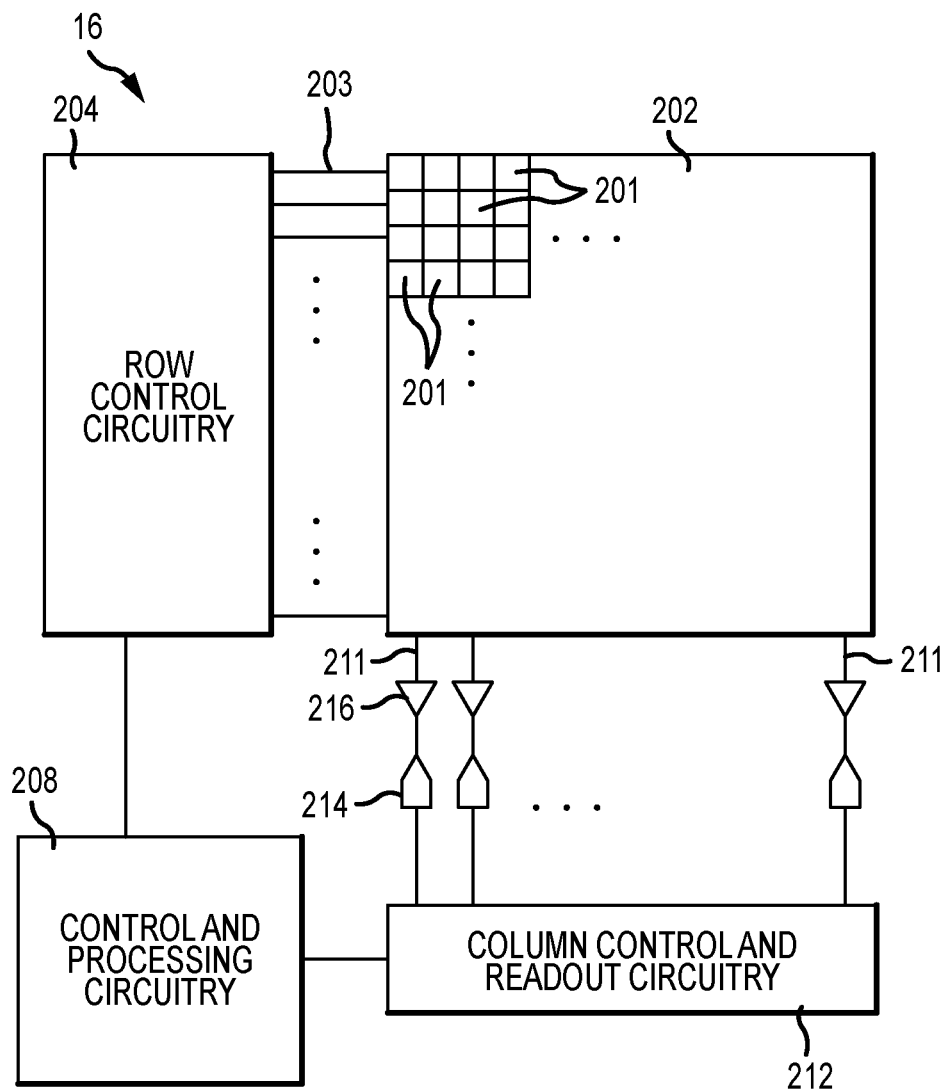
FIG. 2 is a diagram of an illustrative image pixel array in an image sensor in accordance with an embodiment.

FIG. 2 is a diagram of an illustrative image pixel array in an image sensor As shown in FIG. 2, image sensor 16 may include pixel array 202 having multiple pixels 201 (sometimes referred to herein as image pixels or image sensor pixels for imaging a scene) and row control circuitry 204 that is coupled to image pixel array 202. Row control circuitry 204 may provide pixel control signals (e.g., row select signals, reset signals, charge transfer signals, etc.) to pixels 201 over corresponding row control lines 203 to control the capture of a scene and to read out images using image sensor pixels in array 202.

Image sensor 16 may also include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. An optional column amplifier 216 (e.g., a programmable gain amplifier) and an analog-to-digital converter (ADC) 214 and may be interposed in each column line 211 for amplifying analog signals captured by pixels in that pixel column and converting the analog signals to corresponding digital pixel data. Column control and readout circuitry 212 may be coupled to external hardware such as storage and processing circuitry 18 (see FIG. 1). Column control and readout circuitry 212 may perform column readout based on signals received from control and processing circuitry 208. Column ADC circuits 214 and amplifiers 216 are sometimes considered to be part of column control and readout circuitry 212.

Figure 3:
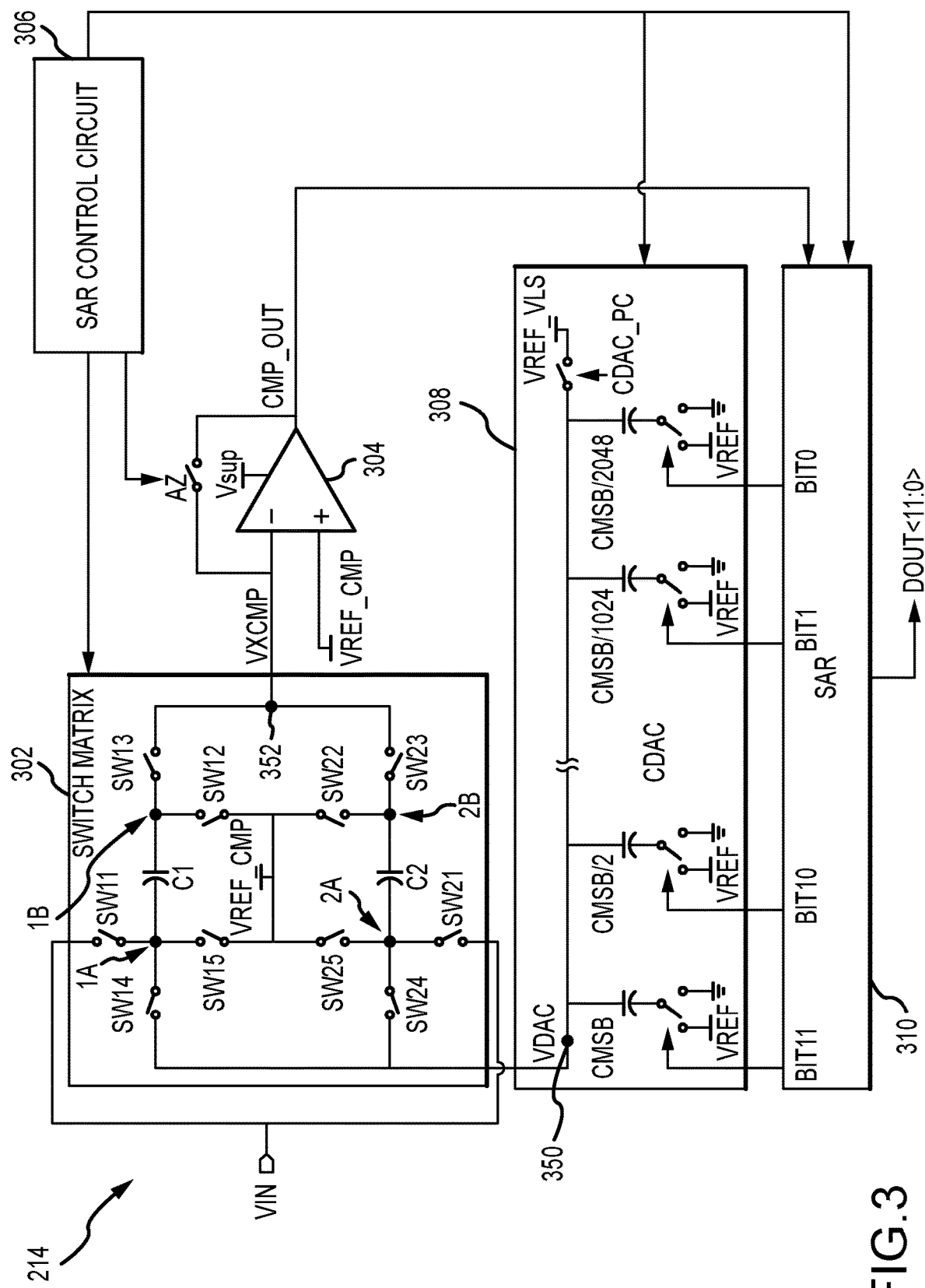
FIG. 3 is a circuit diagram of an illustrative successive approximation register (SAR) analog-to-digital converter (ADC) that may be included in an image sensor in accordance with an embodiment.

In accordance with an embodiment, ADC 214 may be implemented as a successive approximation register (SAR) ADC circuit. FIG. 3 is a circuit diagram of an illustrative SAR ADC 214 that uses a binary search algorithm implemented using a digital-to-analog converter (DAC) such as a capacitive digital-to-analog converter (CDAC) 308, a comparator circuit such as comparator 304, a successive approximation register 310, a controller such as SAR control circuit 306, and associated input switching and sampling circuit 302 (sometimes referred to as a switch matrix).

Converter 214 has an input terminal configured to receive an analog input signal VIN. Input signal VIN may be provided directly from a pixel column output line 211 or optionally at the output of amplifier 216 (see FIG. 2). Input signal VIN may be selectively coupled to node 1A via first input sampling switch SW11 and selectively coupled to node 2A via second input sampling switch SW21. If desired, the input terminal can be split into two individual input ports to receive signals VIN1 and VIN2, each of which has its own pair of input sampling capacitors (with a total of four input sampling capacitors). Only two input sampling capacitors C1 and C2 are shown for input VIN for brevity. In other suitable arrangements, the input terminal may be split into any number of input ports, each of which can receive signals using its own set of sampling capacitors.

Node 1A may be selectively precharged to comparator reference voltage VREF_CMP via switch SW15 and may be coupled to node 1B via first input sampling capacitor C1. Node 1B may be selectively precharged to reference voltage VREF_CMP via switch SW12 and may be selectively coupled to a first (negative) input terminal of comparator 304 via switch SW13. Similarly, Node 2A may be selectively precharged to comparator reference voltage VREF_CMP via switch SW25 and may be coupled to node 2B via second input sampling capacitor C2. Node 2B may be selectively precharged to comparator reference voltage VREF_CMP via switch SW22 and may be selectively coupled to the first (−) input terminal of comparator 304 via switch SW23.

Voltage VXCMP may be provided at the first input of comparator 304 (i.e., at input node 352). Comparator 304 may have a second (positive) input configured to receive reference voltage VREF_CMP and an output on which comparator output signal CMP_OUT is generated. An autozero switch AZ may be coupled across the first input and the output terminals of comparator 304. Configured in this way, comparator 304 would drive CMP_OUT higher whenever VXCMP falls below VREF_CMP and would drive CMP_OUT lower whenever VXCMP exceeds VREF_CMP. In an equilibrium state, comparator 304 would drive VXCMP equal to VREF_CMP.

Comparator output CMP_OUT may be fed to successive approximation register 310, which includes registers that output control bits to CDAC 308. In the example of FIG. 3, CDAC 308 may be a 12-bit capacitive DAC circuit, with binary-weighted capacitors such as capacitor CMSB that is selectively coupled to reference voltage VREF by using SAR 310 to assert control bit BIT11, capacitor CMSB/2 that is selectively coupled to reference voltage VREF by using SAR 310 to assert control bit BIT10, . . . , capacitor CMSB/1024 that is selectively coupled to reference voltage VREF by using SAR 310 to assert control bit BIT1, and capacitor CMSB/2048 that is selectively coupled to reference voltage VREF by using SAR 310 to assert control bit BIT0. The other terminal of all the CDAC capacitors may be connected to CDAC output node 350 on which CDAC output voltage VDAC is provided. Output node 350 may be selectively coupled to a level-shifted reference voltage VREF_VLS via CDAC precharge switch CDAC_PC. Node 350 may also be selectively coupled to node 1A via feedback switch S14 and to node 1B via feedback switch 24.

SAR control circuit 306 may be configured to control the various switches in the switch matrix 302 (e.g., input switches S11, S12, S13, S14, S15, S21, S22, S23, S24, and S25), the comparator autozeroing switch AZ, SAR circuit 310, and also switch CDAC_PC in CDAC 308. As an example, VREF and VREF_VLS may be at 1V while VREF_CMP can operate at a lower VREF_CMP voltage of 0.6V. The comparator 304 may be powered by a comparator supply voltage (see supply voltage Vsup that is powering comparator 304 in FIG. 5A) that is greater than reference voltage VREF_CMP. As an example, the comparator supply voltage Vsup might be 1.2V. Meanwhile, input signal VIN can be allowed to operate at a higher input common-mode range (e.g., between 1V and 2V) and is not limited by the comparator supply voltage level. At the end of conversion, SAR circuit 310 may generate a digital signal DOUT<11:0> corresponding to the digital equivalent of the sampled input signal VIN.

Figure 4:
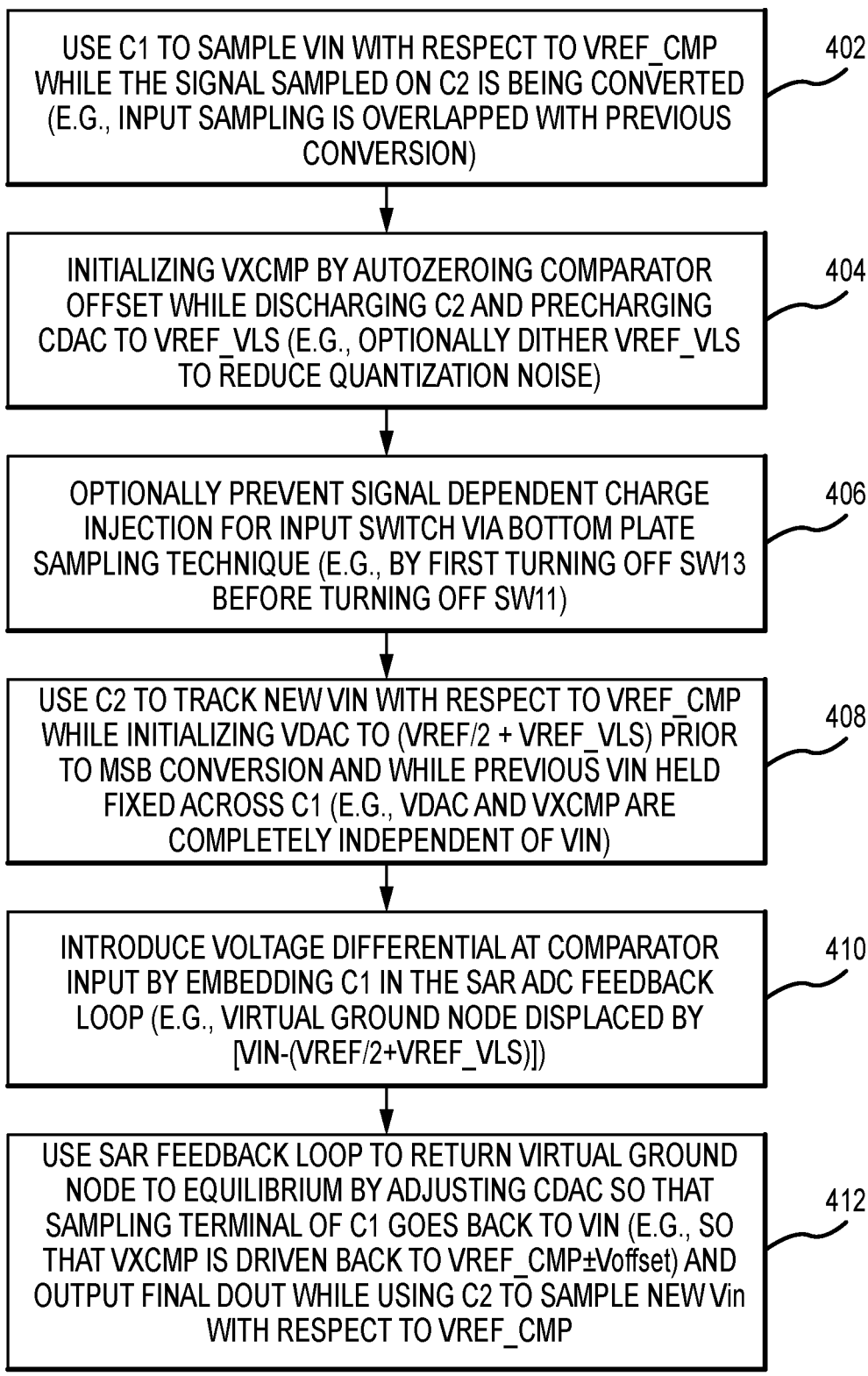
FIG. 4 is a flow chart of illustrative steps for operating a SAR ADC circuit of the type shown in FIG. 3 in accordance with an embodiment.

FIG. 4 is a flow chart of illustrative steps for operating a SAR ADC circuit of the type shown in FIG. 3. At step 402, the first input sampling capacitor C1 may be used to sample input signal VIN with respect to VREF_CMP (e.g., by coupling node 1A to VIN via switch SW11 and by coupling node 1B to VREF_CMP via switch S12). Meanwhile, the previous input signal sampled on the second input sampling capacitor C2 may be undergoing conversion using CDAC 308. In other words, the current input sampling will overlap with the previous conversion (e.g., the sampling at C1 may at least partially overlap with the conversion of signal held on C2, and vice versa).

At step 404, comparator input voltage VXCMP at node 352 may be initialized by autozeroing the comparator offset (e.g., by turning on switch AZ to comparator offset and cancel out any low frequency noise) while completely discharging capacitor C2 and precharging CDAC 308 to voltage level VREF_VLS (e.g., by connecting the bottom terminals of all CDAC capacitors to ground while connecting the top terminals of all CDAC capacitors to VREF_VLS by turning on switch CDAC_PC). At this time, voltage VREF_VLS may optionally be dithered to reduce quantization noise for ADC 214 (e.g., dithering VREF_VLS can help adjust the input signal common-mode voltage to improve the dynamic range of ADC 214).

At step 406, signal dependent charge injection from the first input sampling switch SW11 may be optionally prevented via a bottom plate sampling technique (e.g., by first turning off switch SW13 before turning off switch SW11). By first disabling switch S13, any charge that is potentially injected by switch 11 when it is later turned off will have nowhere to flow since node 1B will be electrically floating after switch 13 is shut off.

At step 408, the second input sampling capacitor C2 may be used to track a new input signal VIN with respect to VREF_CMP (e.g., by coupling node 2A to VIN via switch S21 and by coupling node 2B to VREF_CMP via switch SW22). Meanwhile, the CDAC output voltage VDAC may be initialized to midscale voltage level VREF/2 prior to the most significant bit (MSB) conversion of the input signal held at capacitor C1. The previous input signal VIN is held fixed across capacitor C1 (e.g., the voltage across capacitor C1 is held at (VIN−VXCMP)). At this point, the VDAC voltage at node 350 and the VXCMP voltage at node 352 are still completely independent of input signal VIN. At equilibrium, VXCMP will be driven by comparator 304 to be equal to a predetermined voltage of (VREF_CMP±Voffset), thus establishing the virtual ground potential of the SAR ADC 214 at node 352, and VDAC will be equal to a predetermined voltage of (VREF/2+VREF_VLS). Voltage Voffset represents an inherent/parasitic offset associated with comparator 304. In other words, node 1A on one side of capacitor C1 is fixed at VIN, whereas node 1B on the other side of C1 is fixed at (VREF_CMP±Voffset) at equilibrium.

At step 410, a voltage differential may be introduced to the first comparator input by embedding input sampling capacitor C1 in the SAR ADC feedback loop (e.g., by connecting the input sampling capacitor in series between node 350 and node 352). Connected in this way, the voltage across capacitor C1 cannot change (since node 352 is in a high impedance state), so the virtual ground node 352 will necessarily have to be displaced from its equilibrium level by [VIN−(VREF/2+VREF_VLS)].

At step 412, the SAR ADC feedback loop may be used to bring the virtual ground node 352 back to equilibrium by adjusting CDAC 308 so that node 1A returns back to the VIN level (e.g., so that VXCMP is driven back to (VREF_CMP±Voffset). After conversion of VIN, SAR 310 may output the final digital output value DOUT while using the second input sampling capacitor to sample the new VIN with respect to VREF_CMP. These steps may be repeated so that sampling and conversion can alternate and overlap between capacitors C1 and C2.

SAR ADC 214 implemented in this way may exhibit variety of technical improvements. By embedding the input sampling capacitor in the SAR ADC feedback loop in this way, the input voltage sampled across the input sampling capacitor(s) may be efficiently transferred to the CDAC 308 during the ADC conversion process without any charge sharing between the input sampling capacitors and the CDAC capacitors. The elimination of charge sharing enables ADC 214 to be immune to any potential mismatch between capacitors C1 and C2, which improves the overall signal-to-noise ratio (SNR). Configured in this way, ADC 214 can also accept input signals VIN with common-mode voltage ranges above the comparator supply voltage (e.g., ADC 214 can accept input signals with common-mode voltages greater than the ADC supply voltage range without any signal attenuation). This enables ADC 214 to operate with a lower supply voltage range as compared to VIN, which can help improve performance while saving power. Moreover, tuning VREF_VLS at step 404 can help dither the input signal common-mode voltage to improve its dynamic range without ADC gain variation. ADCs arranged and operated in this way can therefore exhibit low power and small silicon footprint and can benefit from technology scaling (e.g., as power supply level reduces and as devices become faster).

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Figure 5A:
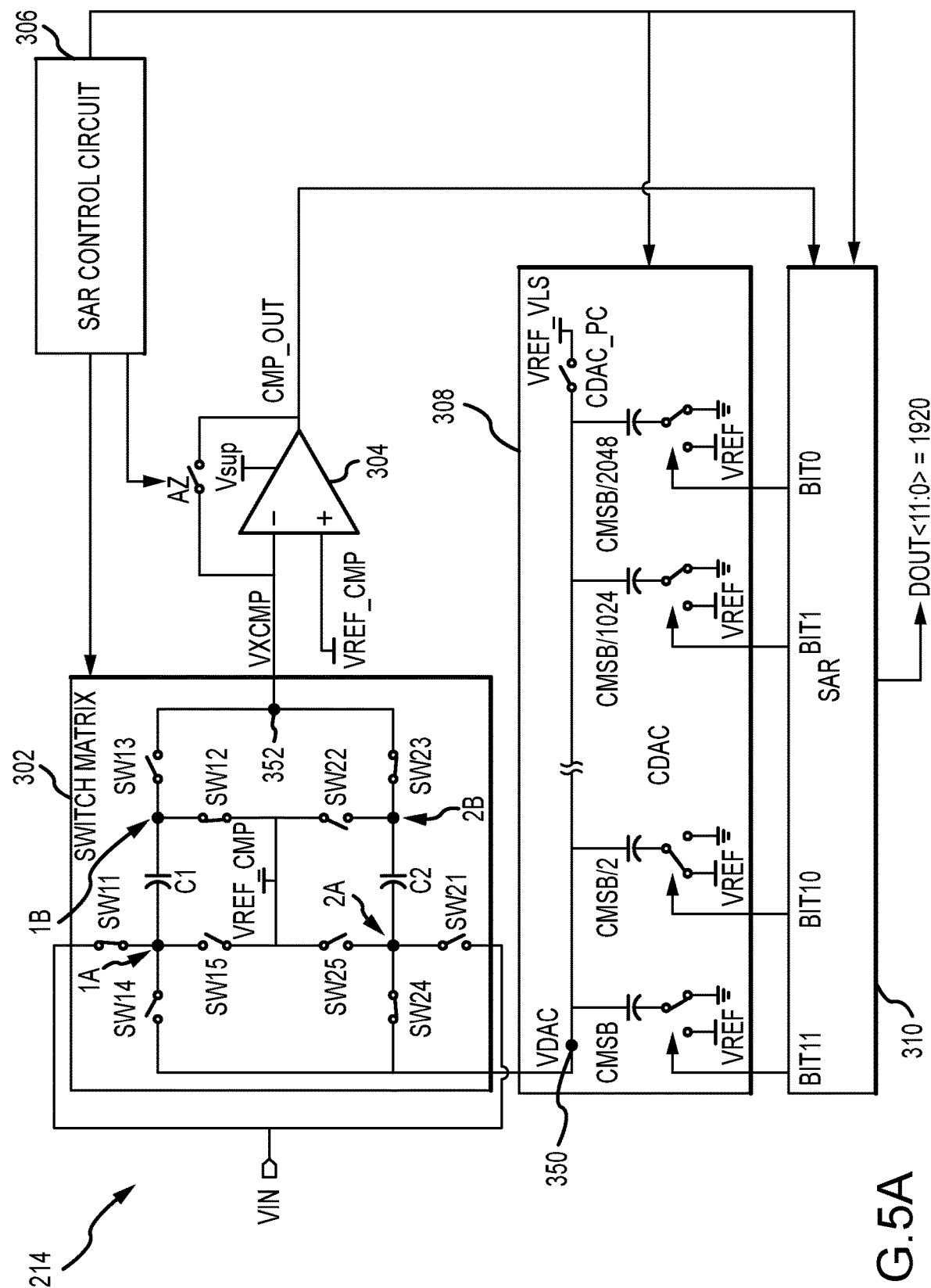
FIGS. 5A-5F are diagrams showing different phases of operating the SAR ADC shown in FIG. 3 using the steps of FIG. 4 in accordance with an embodiment.

FIGS. 5A-5F are diagrams showing different phases of operating SAR ADC 214 using the steps of FIG. 4. FIG. 5A illustrates a first phase (corresponding to step 402 of FIG. 4) when first input sampling capacitor C1 is tracking input signal VIN and while the voltage across the second input sampling capacitor C2 is being converted. As shown in FIG. 5A, switch SW11 may be turned on to connect capacitor C1 to VIN, switch S12 may be turned on to connect the other terminal of capacitor C1 to VREF_CMP, and switches S23 and S24 may be turned on to embed input sampling capacitor C2 within the SAR ADC feedback loop during the conversion process. In the example of FIG. 5A, the final 12-bit DOUT value corresponding to the previously sampled VIN held across capacitor C2 may be equal to 1920 (e.g., DOUT may be equal to "011110000000").

Figure 5B:
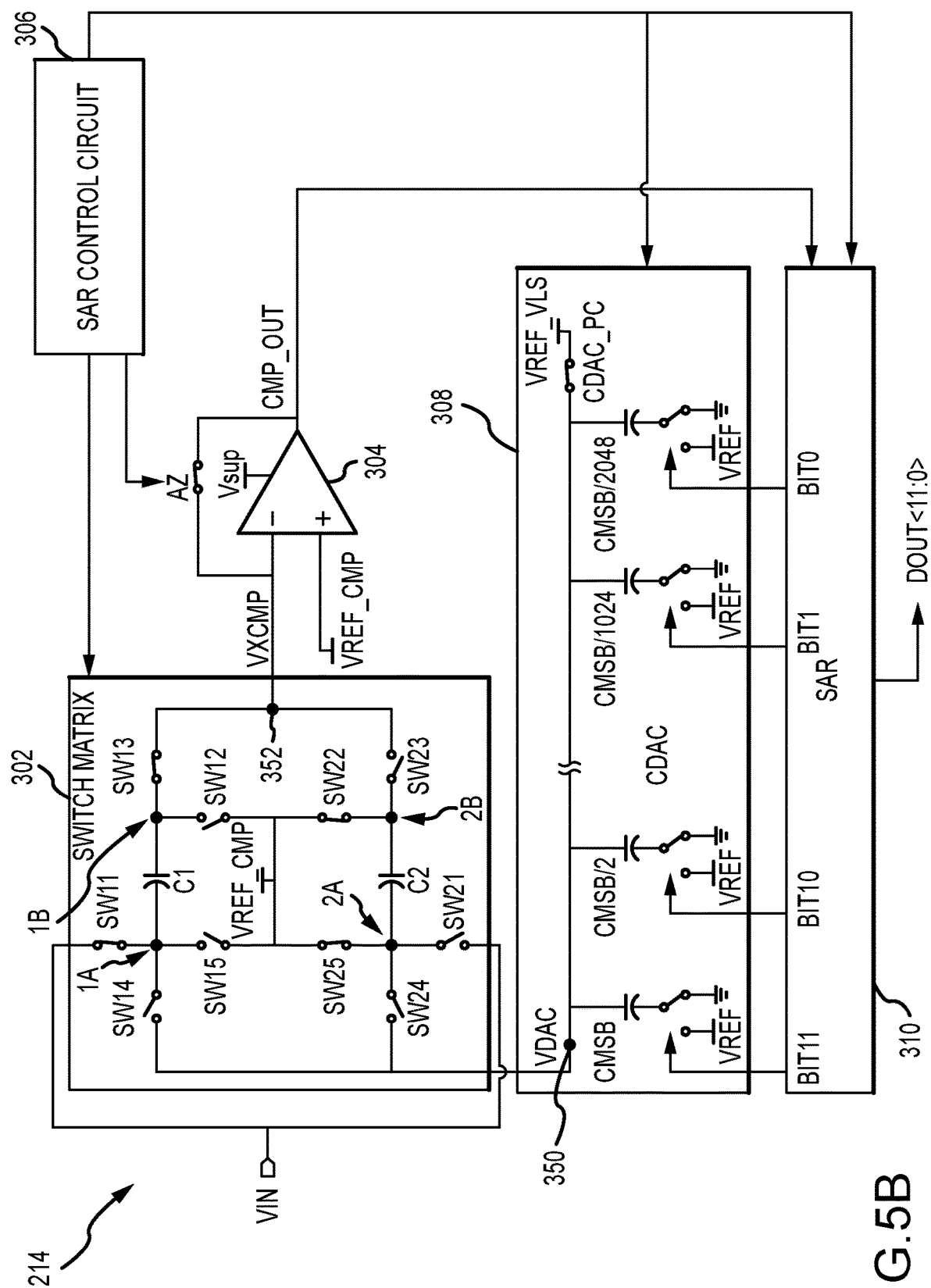

FIG. 5B illustrates a second phase (corresponding to step 404 of FIG. 4) when capacitor C1 is effectively autozeroed with respect to VIN, capacitor C2 is discharged, and all of the CDAC capacitors are precharged. The first input sampling capacitor is autozeroed with respect to VIN by turning on both switches SW13 and AZ. The second input sampling capacitor C2 is discharged by shorting nodes 2A and 2B to VREF_CMP via switches SW25 and SW22, respectively. All of the CDAC capacitors are precharged by connecting each of the CDAC capacitors between the ground line and VREF_VLS (e.g., by asserting precharge switch CDAC_PC). Precharging the CDAC capacitors to a predetermined voltage VREF_VLS along with the capacitor coupling architecture will enable the common-mode level translation of the input signal (e.g., to shift the input common-mode level down by some desired level that can be handled by comparator 304 operating at the lower supply). Moreover, voltage VREF_VLS to which the CDAC is precharged can be dithered to effectively dither the common-mode level of VIN, which effectively randomizes any missing code errors to help increase the signal-to-noise ratio of ADC 214.

Figure 5C:
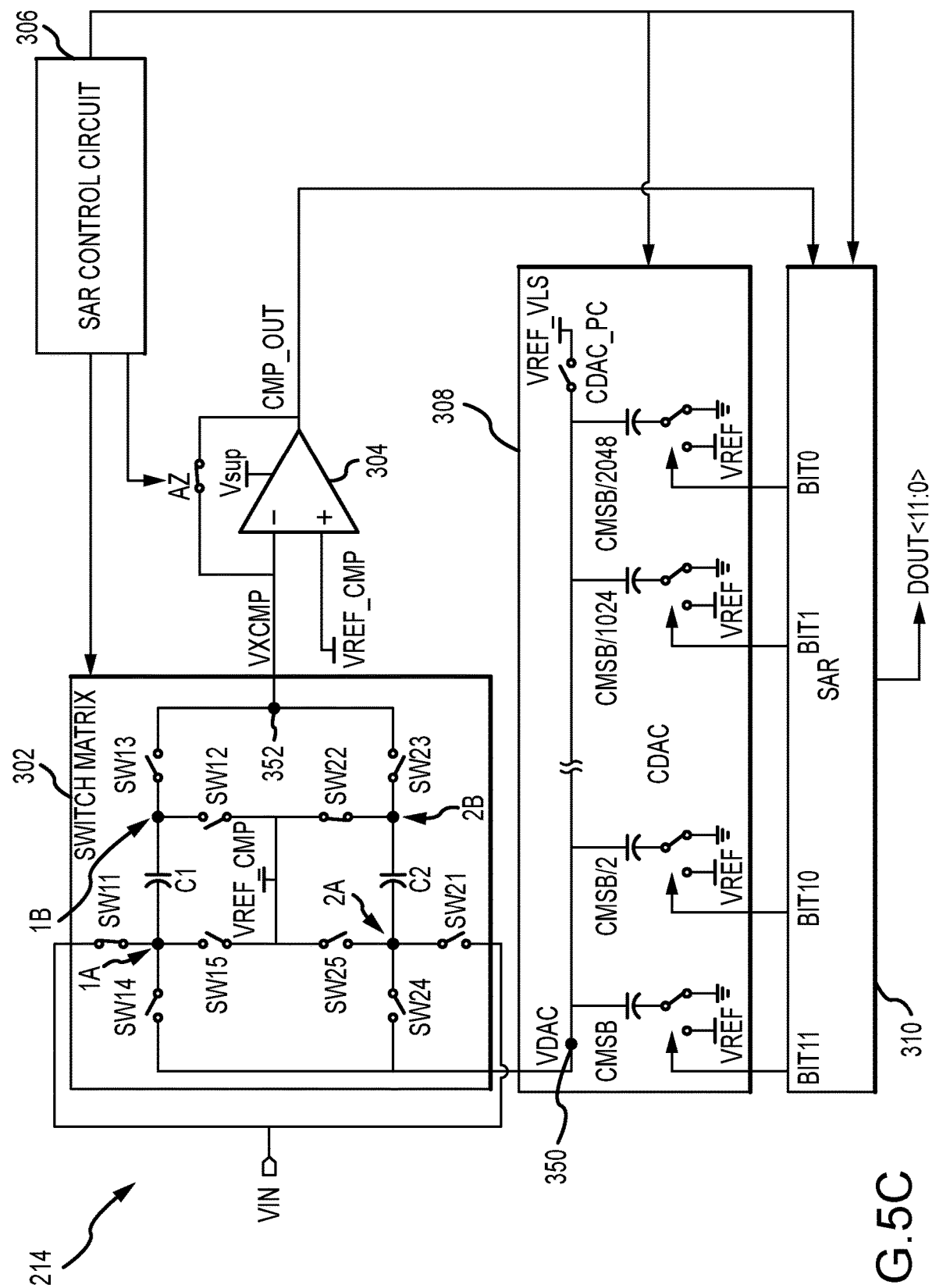

FIG. 5C illustrates a third optional phase (corresponding to step 406 of FIG. 4) where signal dependent charge injection from switch SW11 is prevented by first turning off switch SW13. By first disabling switching SW13 before SW11 is turned off, node 1B will become a high impedance node, so the charge at that node cannot change.

Figure 5D:
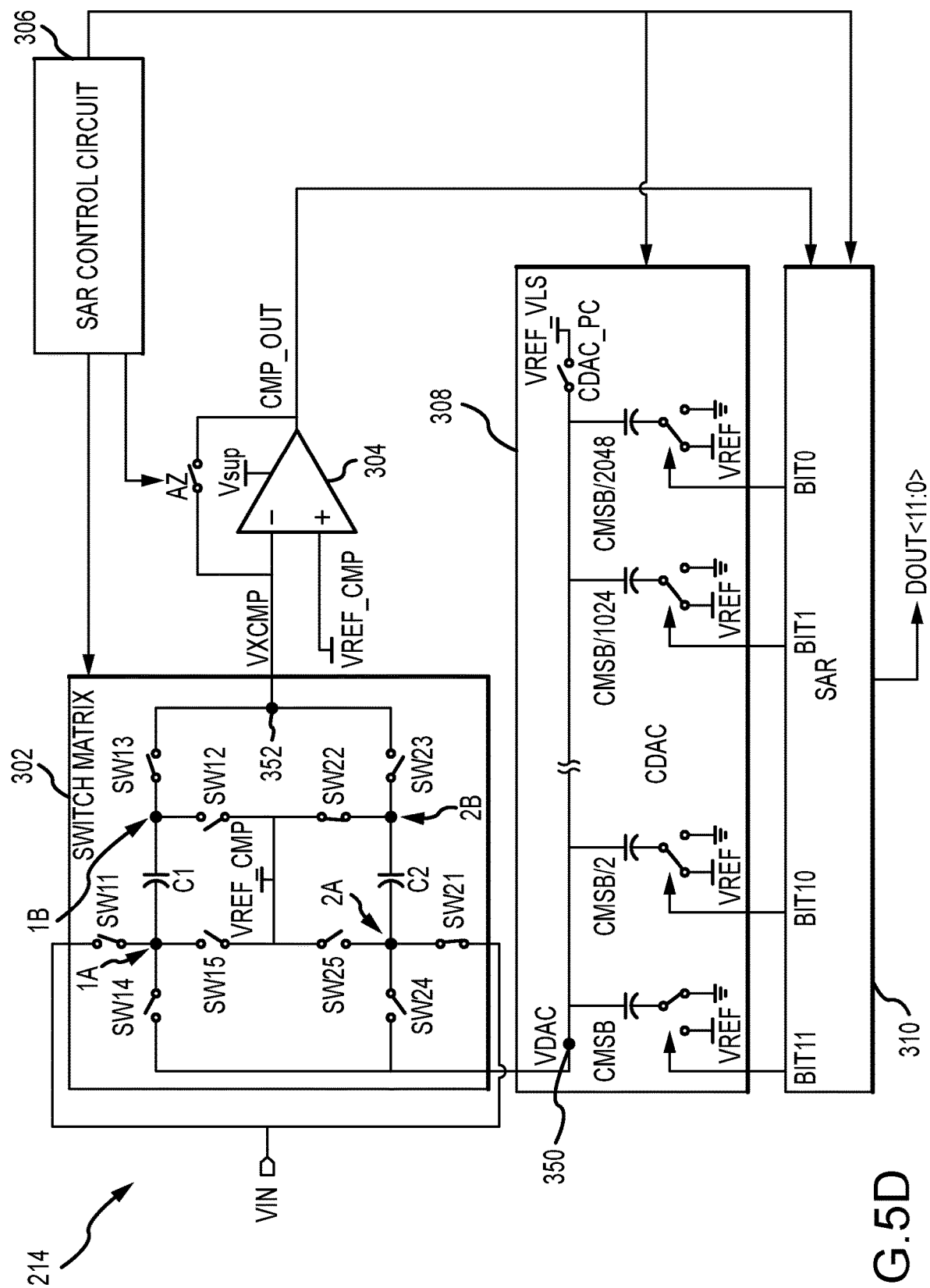

FIG. 5D illustrates a fourth phase (corresponding to step 408 of FIG. 4) where the second input sampling capacitor C2 begins to track input signal VIN and a midscale voltage of VREF/2 is injected into the CDAC capacitors. As shown in FIG. 5D, switch SW21 may be turned on to connect capacitor C2 to VIN, and switch S22 may be turned on to connect the other terminal of capacitor C2 to VREF_CMP.

During this phase, the MSB of the SAR may be low while all remaining bits are high to inject the midscale voltage. At the end of this phase, voltage VDAC may be initialized to (VREF_VLS+VREF/2) immediately prior to conversion. In particular, node 1A may be at the sampled VIN level, whereas node 1B may be at VXCMP (which is initialized to VREF_CMP±Voffset). At this point, note that the initialization of VXCMP at node 352 and the initialization of VDAC at node 352 are independent of VIN (i.e., VXCMP and VDAC are not dependent on the input common-mode voltage level). Node 352 may serve as the virtual ground node for the SAR ADC feedback loop.

Figure 5E:
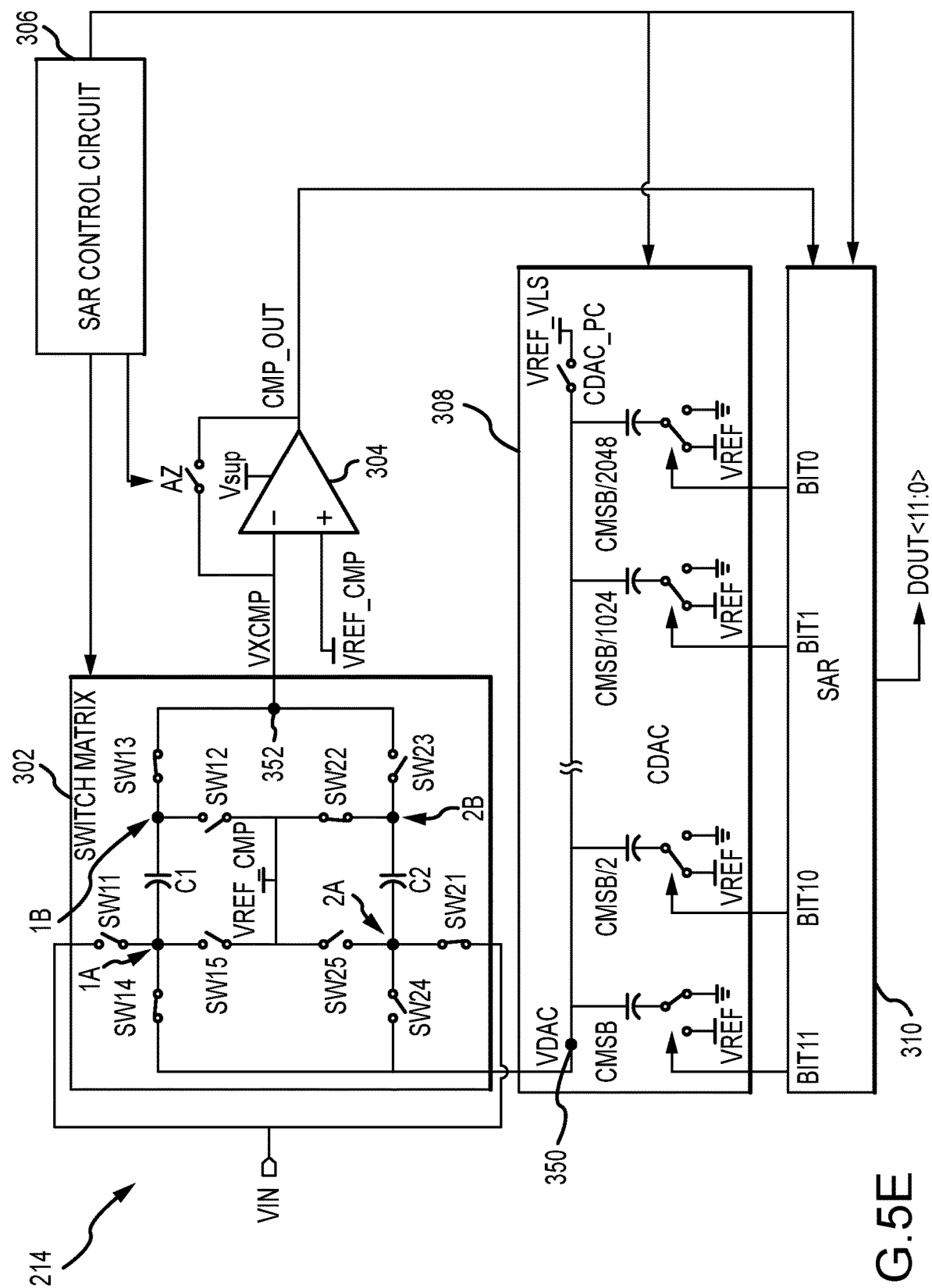

FIG. 5E illustrates a fifth phase (corresponding to step 410 of FIG. 4) where input sampling capacitor C2 continues to track VIN and where the MSB conversion for the voltage across C1 begins by embedding C1 in the SAR ADC feedback loop (e.g., by turning on switches SW14 and SW13). Note that input sampling capacitor C1 is never connected in parallel with the CDAC capacitors, so charge sharing is never allowed to occur (e.g., C1 is only connected in series within the feedback loop, and the voltage across C1 never changes). Node 1A, which was previously at the sampled VIN level, is now connected to VDAC, which is at (VREF_VLS+VREF/2) as described above. As a result, a corresponding voltage displacement/perturbation of [VIN−(VREF_VLS+VREF/2)] will occur at VXCMP (e.g., embedding C1 within the feedback loop will disturb the virtual ground node 352 from its initialized or autozeroed common-mode value by a voltage differential proportional to the input voltage level sampled across C1).

Figure 5F:
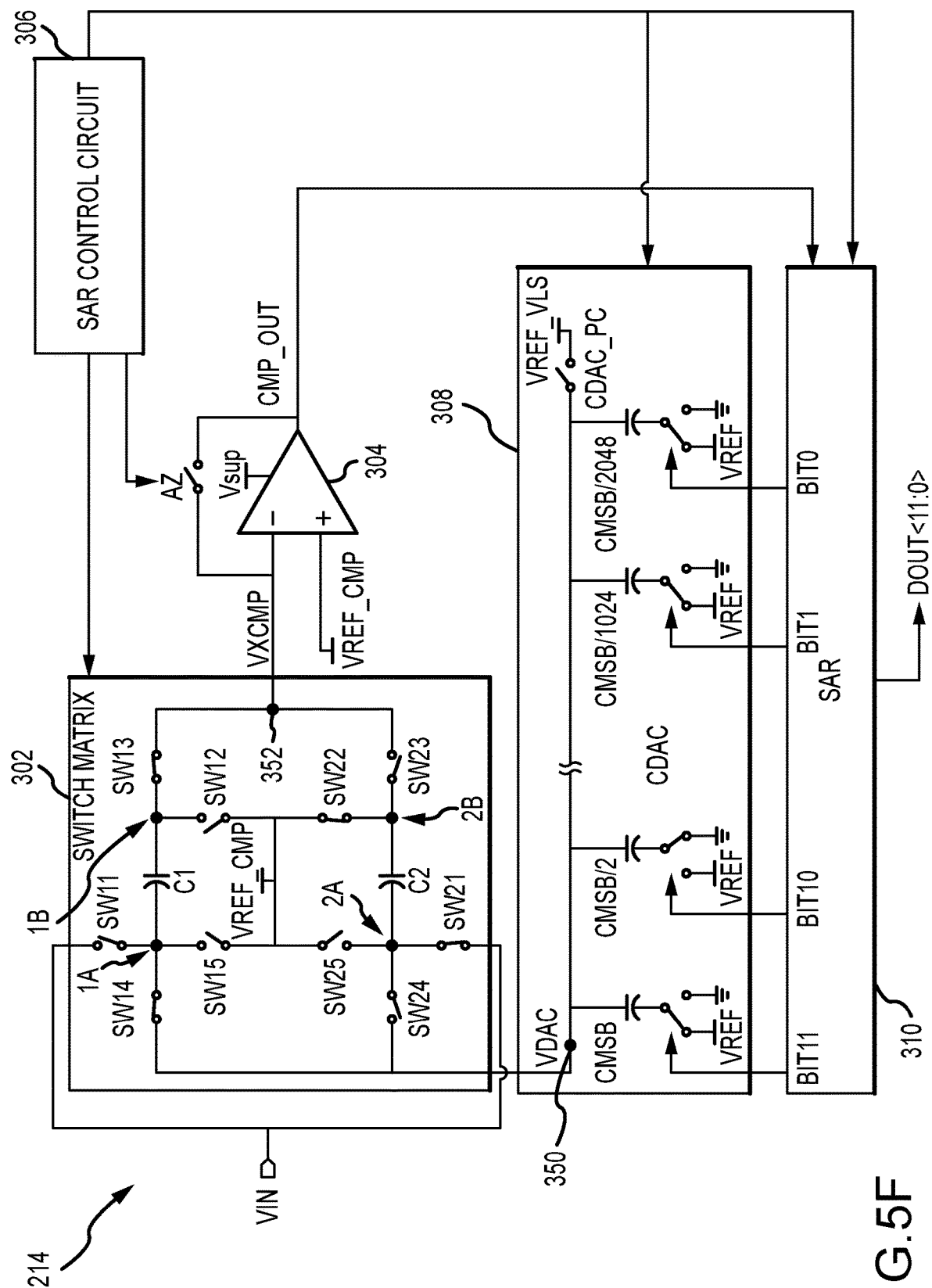

FIG. 5F illustrates a sixth phase (corresponding to step 412 of FIG. 4) where input sampling capacitor C2 continues to track VIN and where the second MSB conversion for the voltage across capacitor C1 occurs. The conversion at CDAC 308 may continue towards the remaining LSBs to successively change the value of output voltage VDAC so that VDAC returns to its initial value of VIN just prior to the conversion process, thus effectively digitizing VIN. In other words, the SAR feedback loop will nullify or counteract the voltage disturbance seen at virtual ground node 352 by successively changing VDAC via the process of charge redistribution only within the CDAC capacitors (without sharing charge with any of the input sampling capacitors). Since no charge transfer or charge sharing takes place between the input sampling capacitors and the CDAC capacitors, any potentially negative effects due to mismatch between the individual sampling capacitors and mismatch between the input sampling capacitors and the CDAC capacitors will be eliminated. As a result, ADC 214 may exhibit improved SNR and improved effective number of bits (ENOB) at high speed operations.

Figure 6A:
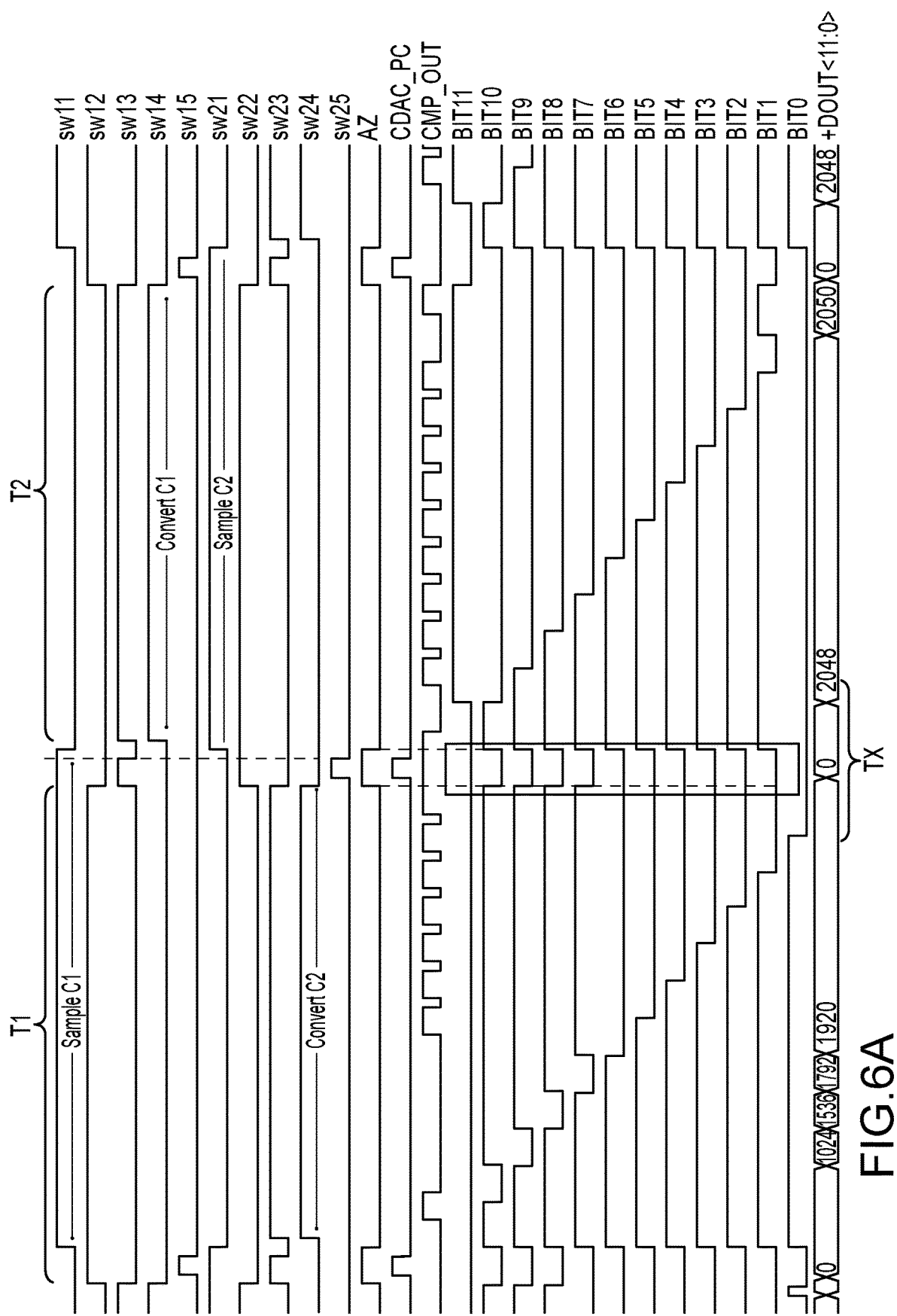
FIGS. 6A-6B are timing diagrams showing illustrative signal waveforms involved in operating a SAR ADC circuit of the type shown in FIG. 3 in accordance an embodiment.

FIG. 6A is a timing diagram showing illustrative signal waveforms involved in operating SAR ADC circuit 214 of the type described in connection with FIGS. 3-5. As shown in FIG. 6A, time interval T1 may correspond to the first phase of FIG. 5A where input sampling occurs on capacitor C1 while conversion of the voltage across capacitor C2 is taking place simultaneously. In other words, sampling and conversion of different input signals can at least partially overlap in time. Time interval T2 may correspond to the sixth phase of FIG. 5F where input sampling occurs on capacitor C2 while conversion of the voltage across capacitor C1 is taking place at the same time. The time interval linking T1 and T2 is labeled as TX in FIG. 6A.

Figure 6B:
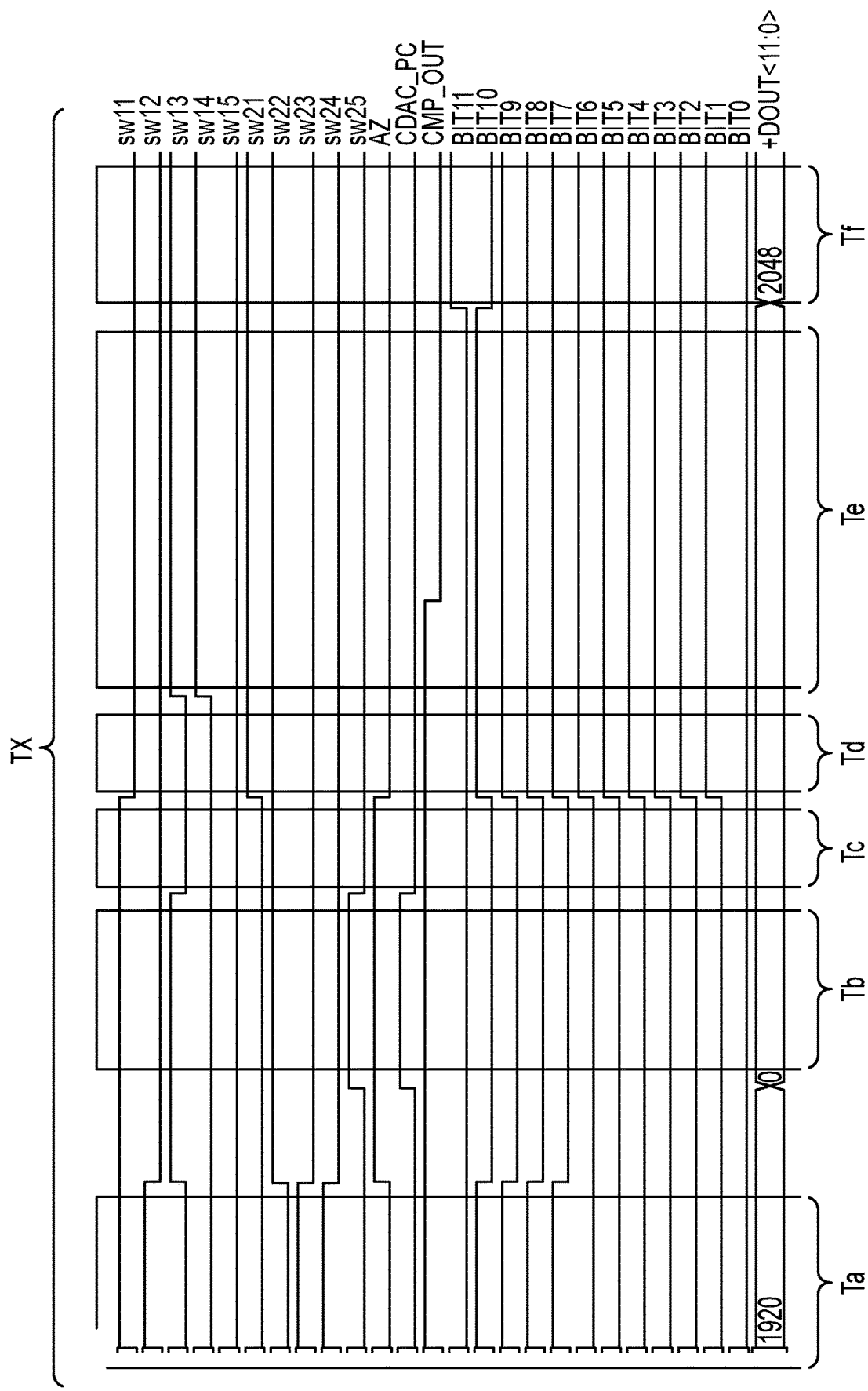

FIG. 6B is a timing diagram that zooms in on interval TX. As shown in FIG. 6B, interval TX may include the tail end of the first phase Ta (corresponding to the snapshot of FIG. 5A) when switches SW11, SW12, SW23, and SW24 are turned on. In this example, the conversion of the voltage across capacitor C2 yields a corresponding digitized Dout of 1920.

Phase Ta may be subsequently followed by a second phase Tb (corresponding to the snapshot of FIG. 5B) when switches SW11, SW13, AZ, SW25, SW22, and CDAC_PC are all turned on. Configured as such, capacitor C2 is discharged and the CDAC capacitors are all precharged to VREF_VLS. At this time, Dout may be reset to zero (see, BIT<11:0> all initialized to logic "0").

Phase Tb may be subsequently followed by a third phase Tc (corresponding to the snapshot of FIG. 5C) when only switches SW11, AZ, and SW22 are on. Switch SW13 may be turned off immediately prior to Tc. Operated as such, signal dependent charge injection from switch S11 may be mitigated by first turning off switch SW13.

Phase Tc may be subsequently followed by a fourth phase Td (corresponding to the snapshot of FIG. 5D) when only switches SW21/SW22 are turned on, and all CDAC capacitors other than the MSB capacitor is coupled to VREF to inject the midscale voltage VREF/2. At this point, VDAC is initialized to (VREF_VLS+VREF/2), whereas VXCMP is initialized to (VREF_CMP±Voffset), both of which are independent of VIN.

Phase Td may be subsequently followed by a fifth phase Te (corresponding to the snapshot of FIG. 5E) when only switches SW13, SW14, SW21, and SW22 are turned on. During this time, input sampling capacitor C1 may be connected in series between the VDAC node 350 and the comparator virtual ground node 352, thereby displacing VXCMP by some value proportional to VIN sampled using C1. Even with switch SW14 turned on, no charge sharing will occur between input sampling capacitor C1 and the CDAC capacitors since nodes 1A and are in the high impedance state. Thus, capacitor C1 acts like a voltage battery connected in series between CDAC 308 and comparator 304 during conversion.

Phase Te may be subsequently followed by a sixth phase Tf (corresponding to the snapshot of FIG. 5F), which shows the leading portion of interval T2 (see FIG. 6A). During this time, switches SW13, SW14, SW21, and SW22 are turned on, and the CDAC resolves the next bit of conversion (e.g., by setting BIT11 high while setting BIT10 low). Conversion of the voltage across C1 may continue until the SAR feedback loop nullifies the voltage displacement of VXCMP so that VDAC is driven back to the initial VIN level immediately prior to the fifth phase.

ADC circuits implemented in this way may be suitable for high speed and high dynamic range image sensors while keeping power, structural noise, and silicon area low. Moreover, such types of ADC circuits can operate at low power levels and are easily scalable to newer technology nodes.

The foregoing is merely illustrative of the principles of this invention and various modifications can be made by those skilled in the art. The foregoing embodiments may be implemented individually or in any combination.

What is claimed is:
1. An image sensor, comprising:
a plurality of image sensor pixels; and
an analog-to-digital converter (ADC) circuit having an input configured to receive an input signal from the plurality of image sensor pixels, wherein the ADC circuit comprises:
a first input sampling capacitor;
a second input sampling capacitor;

a comparator having an input that is selectively coupled to the first and second input sampling capacitors; and a digital-to-analog converter (DAC) circuit having a plurality of capacitors and an output on which a digital-to-analog converter (DAC) voltage is generated, wherein the first input sampling capacitor is coupled in series between the output of the DAC circuit and the input of the comparator during conversion, and wherein the second input sampling capacitor is used to sample another input signal while the first input sampling capacitor is coupled in series between the output of the DAC circuit and the input of the comparator during the conversion.

2. The image sensor of claim 1, wherein the comparator is configured to receive a comparator supply voltage, and wherein the input signal has a common-mode voltage that is greater than the comparator supply voltage.

3. The image sensor of claim 1, wherein the comparator is configured to receive a comparator supply voltage, and wherein the plurality of capacitors of the DAC circuit is precharged using a level-shifted voltage that is greater than the comparator supply voltage.

4. The image sensor of claim 3, wherein the input signal has a common-mode voltage that is dithered to increase a signal-to-noise of the ADC circuit by dithering the level-shifted voltage.

5. The image sensor of claim 1, wherein the ADC circuit further comprises:

an autozero switch connected to the comparator, wherein the first input sampling capacitor is selectively shorted to the input of the comparator while the autozero switch is turned on.

6. The image sensor of claim 5, wherein the second input sampling capacitor is discharged while the first input sampling capacitor is selectively shorted to the input of the comparator.

7. The image sensor of claim 1, wherein the ADC circuit further comprises:

a first switch coupled between the first input sampling capacitor and the input of the ADC circuit; and a second switch coupled between the first input sampling capacitor and the input of the comparator, wherein the second switch is turned off before the first switch is turned off to prevent signal dependent charge injection from the first switch.

8. The image sensor of claim 1, wherein the ADC circuit is further configured to inject a midscale voltage onto the DAC circuit prior to the conversion.

9. The image sensor of claim 8, wherein the input of the comparator is initialized to a first predetermined voltage that is a function of a comparator offset voltage prior to the conversion.

10. The image sensor of claim 9, wherein the output of the DAC circuit is initialized to a second predetermined voltage that is a function of the midscale voltage and a level-shifted voltage that is used to precharge the plurality of capacitors of the DAC circuit prior to the conversion.

11. The image sensor of claim 10, wherein the first and second predetermined voltages are independent of the input signal received at the input of the ADC circuit.

12. The image sensor of claim 1, wherein a voltage level at the input of the comparator is displaced by a voltage that is a function of the input signal during the conversion, and wherein a feedback loop of the ADC circuit is configured to counteract the voltage displacement at the input of the comparator during the conversion.

13. A method of operating an image sensor having a plurality of pixels and an analog-to-digital converter (ADC) circuit, the method comprising:

using the plurality of pixels to image a scene;

using the ADC circuit to receive an input signal from the plurality of pixels;

with a first sampling capacitor in the ADC circuit, sampling the input signal;

with a capacitive digital-to-analog converter (CDAC) circuit in the ADC circuit, generating an output voltage; and preventing charge sharing between the first input sampling capacitor and a plurality of capacitors in the CDAC circuit by embedding the first sampling capacitor within a feedback loop of the ADC circuit.

14. The method of claim 13, further comprising:

using the CDAC circuit to convert a signal on a second sampling capacitor in the ADC circuit while the first sampling capacitor is sampling the input signal.

15. The method of claim 14, further comprising:

performing autozeroing on a comparator in the ADC circuit;

while autozeroing the comparator, discharging the second sampling capacitor and precharging the plurality of capacitors in the CDAC circuit using a level-shifted voltage.

16. The method of claim 15, further comprising:

dithering the level-shifted voltage to reduce quantization noise for the ADC circuit.

17. The method of claim 15, further comprising:

using a first switch to couple the first sampling capacitor to the plurality of pixels;

using a second switch to couple the first sampling capacitor to the comparator; and preventing signal dependent charge injection of the first switch by turning off the second switch before turning off the first switch.

18. The method of claim 15, further comprising:

initializing the output voltage of the CDAC circuit prior to converting the input signal; and initializing an input of the comparator prior to converting the input signal.

19. The method of claim 18, wherein embedding the first sampling capacitor within the feedback loop of the ADC circuit introduces a voltage differential at the input of the comparator, and wherein the feedback loop of the ADC circuit nullifies the voltage differential when converting the input signal.

20. An analog-to-digital converter, comprising:

a first input sampling capacitor;

a second input sampling capacitor;

a comparator selectively coupled to the first and second input sampling capacitors; and a digital-to-analog converter (DAC) selectively coupled to the first and second input sampling capacitors, wherein the DAC comprises a plurality of capacitors, and wherein charge sharing between the first input sampling capacitor and the plurality of capacitors in the DAC is prevented to mitigate the effects of mismatch between the first and second input sampling capacitors.

21. The analog-to-digital converter of claim 20, wherein the first input sampling capacitor is selectively coupled between an output of the digital-to-analog converter and an input of the comparator.

22. The analog-to-digital converter of claim 20, wherein the charge sharing between the first input sampling capacitor and the plurality of capacitors in the DAC is prevented by embedding the first input sampling capacitor within a feedback loop of the analog-to-digital converter.

* * * * *